(12) United States Patent
Barbier et al.

(10) Patent No.: US 8,072,796 B2
(45) Date of Patent: *Dec. 6, 2011

(54) MEMORY WITH FIVE-TRANSISTOR BIT CELLS AND ASSOCIATED CONTROL CIRCUIT

(75) Inventors: Jean Barbier, Montpellier (FR); Olivier LePape, Paris (FR); Philippe Piquet, Montigny le Bretonneaux (FR)

(73) Assignee: Meta Systems, Meudon la Foret (FR)

( * ) Notice: Subject to any disclaimer, the term of this patent is extended or adjusted under 35 U.S.C. 154(b) by 182 days.

This patent is subject to a terminal disclaimer.

(21) Appl. No.: 11/929,337

(22) Filed: Oct. 30, 2007

(65) Prior Publication Data

US 2008/0055968 A1 Mar. 6, 2008

Related U.S. Application Data

(63) Continuation of application No. 11/358,161, filed on Feb. 21, 2006, now Pat. No. 7,307,873.

(51) Int. Cl.
*G11C 11/00* (2006.01)
(52) U.S. Cl. ......................... 365/154; 365/104; 365/156
(58) Field of Classification Search .................. 365/154, 365/104, 156, 189.08, 230.06, 89, 185.29
See application file for complete search history.

(56) References Cited

U.S. PATENT DOCUMENTS

| | | | |
|---|---|---|---|
| 3,644,907 A | 2/1972 | Gricchi | |
| 4,075,690 A | 2/1978 | Oberman | |
| 4,567,578 A | 1/1986 | Cohen | |
| 4,750,155 A | 6/1988 | Hsieh | |
| 4,882,708 A * | 11/1989 | Hayakawa et al. | 365/189.04 |
| 4,982,365 A * | 1/1991 | Ohtani et al. | 365/189.11 |
| 5,457,638 A | 10/1995 | Ashar | |
| 5,778,439 A | 7/1998 | Trimberger et al. | |
| 6,044,010 A | 3/2000 | Deschene | |
| 6,205,049 B1 | 3/2001 | Lien | |
| 6,445,209 B1 | 9/2002 | Young et al. | |
| 6,459,611 B2 | 10/2002 | Rimondi | |
| 7,061,820 B2 * | 6/2006 | Deng | 365/227 |
| 7,209,395 B2 * | 4/2007 | Hsu et al. | 365/189.12 |
| 7,218,137 B2 * | 5/2007 | Vadi et al. | 326/38 |
| 7,307,873 B2 * | 12/2007 | Barbier et al. | 365/154 |
| 7,317,343 B1 * | 1/2008 | De La Cruz et al. | 327/295 |
| 7,433,257 B2 * | 10/2008 | Yamagami | 365/226 |
| 2004/0215996 A1 * | 10/2004 | Kanamori et al. | 713/600 |
| 2005/0052201 A1 * | 3/2005 | Bernard et al. | 326/82 |

FOREIGN PATENT DOCUMENTS

EP 0344894 A2 12/1989

OTHER PUBLICATIONS

International Search Report and Written Opinion, issued in International Patent Application No. PCT/EP2007/000655, mailed Apr. 5, 2007, 11 pages.
International Preliminary Report on Patentability, issued in International Patent Application No. PCT/EP2007/000655, mailed Sep. 4, 2008, 8 pages.

* cited by examiner

*Primary Examiner* — Dang Nguyen
(74) *Attorney, Agent, or Firm* — Dickstein Shapiro LLP

(57) ABSTRACT

Memory employing a plurality of five-transistor memory bit cells in a memory matrix and a power supply control circuit that is configured to provide a simultaneous full clear to all of the memory bit cells is described herein.

19 Claims, 9 Drawing Sheets

Global view of memory

MEMORY WITH FIVE-TRANSISTOR BIT CELLS AND ASSOCIATED CONTROL CIRCUIT

RELATED APPLICATION

The present application is a continuation of U.S. Nonprovisional patent application Ser. No. 11/358,161, filed on Feb. 21, 2006, entitled "MEMORY WITH FIVE-TRANSISTOR BIT CELLS AND ASSOCIATED CONTROL CIRCUIT," and claims priority to said nonprovisional application, the specification of which is also hereby fully incorporated by reference in its entirety, except for those sections, if any, that are inconsistent with this specification.

TECHNICAL FIELD

Embodiments of the present invention relate to the field of reconfigurable circuits; in particular, to a reconfigurable integrated circuit having a memory block with a plurality of five-transistor bit cells, an associated controller, and related applications.

BACKGROUND

Integrated circuits are often designed using complementary metal oxide semiconductor (CMOS) technology. With advances in CMOS technology, programmable circuits have been developed to realize a variety of functions, so long as the complexity of the desired function is not too high. An example of a reconfigurable circuit is a Field Programmable Gate Array (FPGA) circuit.

Programmable circuit designs will often use several transistors for each transistor of the target function, making the overall surface area required on a given die to be among the largest circuits made with a given technology. These relatively large integrated circuits often function near the capability limit of the current technology, such that manufacturers are constantly faced with reducing the size of their circuit designs in an effort to reduce problems in production.

One common function found on a programmable circuit is the configuration memory. CMOS-based programmable circuits, such as FPGA circuits, commonly include memory blocks having six transistor (6-T) bit cells, organized into rows and columns to form a matrix of 6-T bit cells. All the 6-T bit cells in a row of a CMOS memory block are typically accessed simultaneously. Likewise, all the 6-T bit cells in a column may be read or written using the same bit lines. Each 6-T bit cell typically requires 2 bit lines or sometimes 2 select lines. Unfortunately, this is problematic for memory within FPGA devices, because the metal layers are very crowded. As a result, FPGA memory often only dedicates 2 metal layers to the memory plane rather than the usual 3 or 4 in conventional ASIC designs, further increasing the size and complexity of corresponding bit cell designs.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

Embodiments of the present invention provide memory circuits and an associated controller that overcome the herein afore-mentioned disadvantages of the heretofore-known devices of this general type and that effectively reduce the size of each memory bit cell in a memory matrix. As the configuration memory of a reconfigurable circuit is seldom written, this characteristic can be exploited resulting in a more efficient bit cell that decreases the area of the configuration memory and helps to improve the routability of the overall design. More specifically, in various embodiments, each bit cell is formed using only five transistors, one bit line, and one select line (see e.g., FIG. 3) and an associated controller is configured to control the power supply to the memory matrix for reading and writing into the bit cells.

Reference in the specification to "one embodiment" or "an embodiment" means that a particular feature, structure, or characteristic described in connection with the embodiment is included in at least one embodiment of the invention. The appearance of the phrase "in one embodiment" in various places in the specification does not necessarily all refer to the same embodiment, but it may. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(A B) or (B)", that is "A" is optional.

Figure 3:
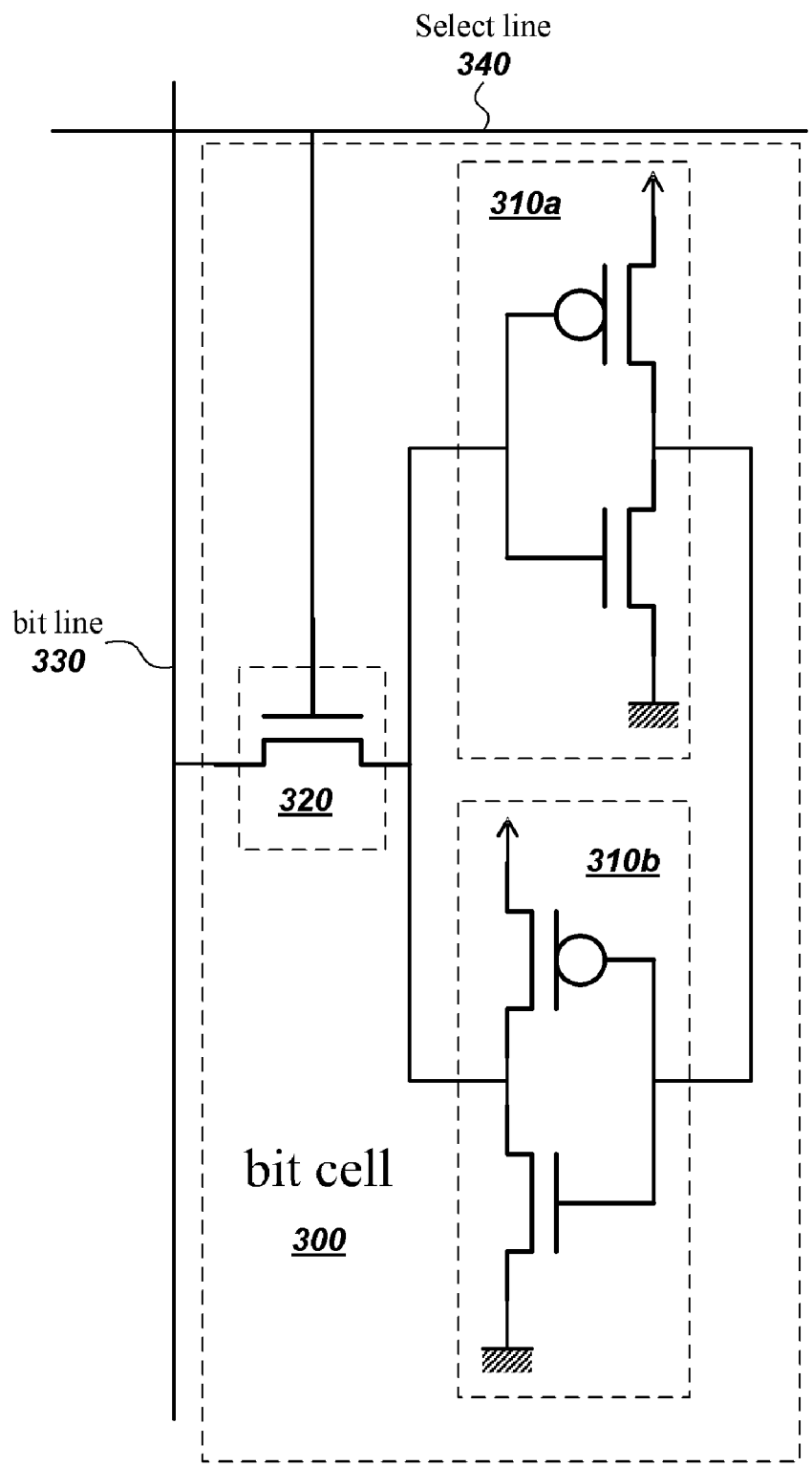
FIG. 3 illustrates a circuit diagram of a portion of a five transistor bit cell, employing an access transistor and a bi-stable loop, in accordance with at least one embodiment of the present invention.

As described earlier, in various embodiments, each bit cell is formed using only five transistors, one bit line and one select line (see e.g., FIG. 3). Two of the five transistors in the bit cell form a first inverter and another two of the five transistors form a second inverter, such that the two inverters form a bi-stable loop. The remaining fifth transistor serves as an access transistor. In one embodiment, the drain, the source, and the gate of the access transistor are each respectively coupled to the input of one of the two inverters, one of the bit lines, and one of the select lines (see e.g., FIG. 3). The controller of the memory circuit coupled to the bit lines and the select lines (see e.g., FIG. 1) is adapted to clear all bit cells by activating all the select lines, driving all bit lines to a designated logic value (configured to be '1' as illustrated in FIG. 3), and causing a power cycle to be initiated on the bit cells. The controller is also configured to selectively set the stored values of the bit cells by selectively activating the select lines and selectively driving the bit lines to logic zero. In one embodiment, the controller is adapted to read the bit cells using the bit lines and the select lines. More specifically, in accordance with a further feature of one embodiment, the controller is adapted to activate a select line to a first level to read a bit cell coupled to the select line, and activate the select line to a second level to set bit cells, the first level being relatively lower than the second level (see e.g., FIG. 8).

Figure 5:
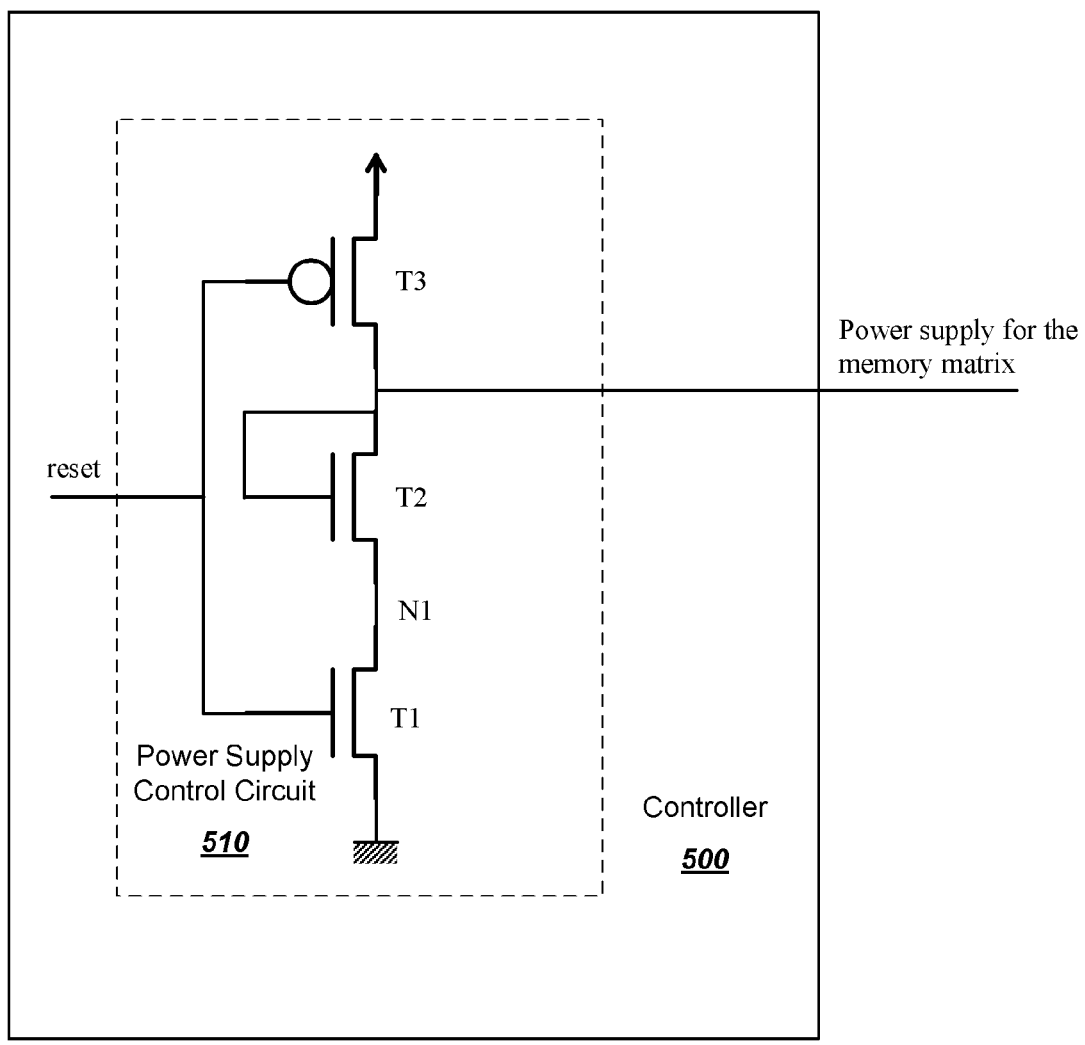
FIG. 5 illustrates a circuit diagram of a portion of a controller, employing a power supply control circuit to control power to a memory matrix, in accordance with at least one embodiment of the present invention.

In accordance with another feature of at least one embodiment of the invention, the controller includes a power supply control circuit adapted to control a power supply supplying power to the bit cells, the power supply control circuit including a P transistor having a source coupled the power supply and a drain coupled to the power supply for the bit cells, a first N transistor serially coupled to the P transistor to serve as a diode, and a second N transistor serially coupled to the first N transistor, the second N transistor having a source coupled to ground (see e.g., FIG. 5). The gate of the P transistor and the second N transistor being coupled to each other and to a reset control line.

Figure 7:
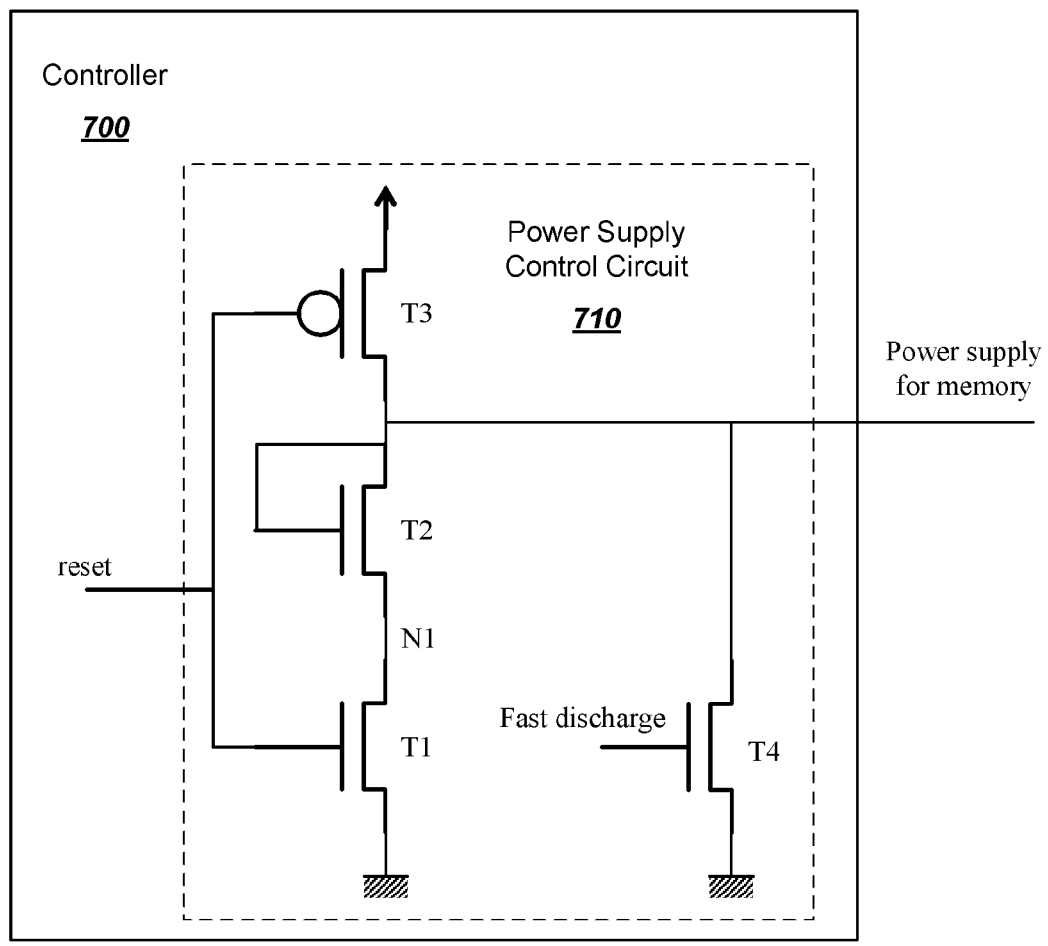
FIG. 7 illustrates a circuit diagram of a portion of a controller, employing a power supply control circuit with a fast discharge, in accordance with at least one embodiment of the present invention.

In accordance with an additional feature of one embodiment, the power supply control circuit includes a third N transistor, having a source coupled to ground and a drain coupled to a power supply for a memory matrix, the power supply control circuit being configured to activate the third N transistor for fast discharge (see e.g., FIG. 7).

In accordance with an added feature of one embodiment, the controller includes a memory matrix power supply control circuit with dual power supply voltage. The memory matrix power supply control circuit includes two P transistors, each P transistor having a source connected to a different power supply. The controller may read or write to the respective bit cell according to which power supply is actuated via the associated P transistor (see e.g., FIG. 8).

Figure 4:
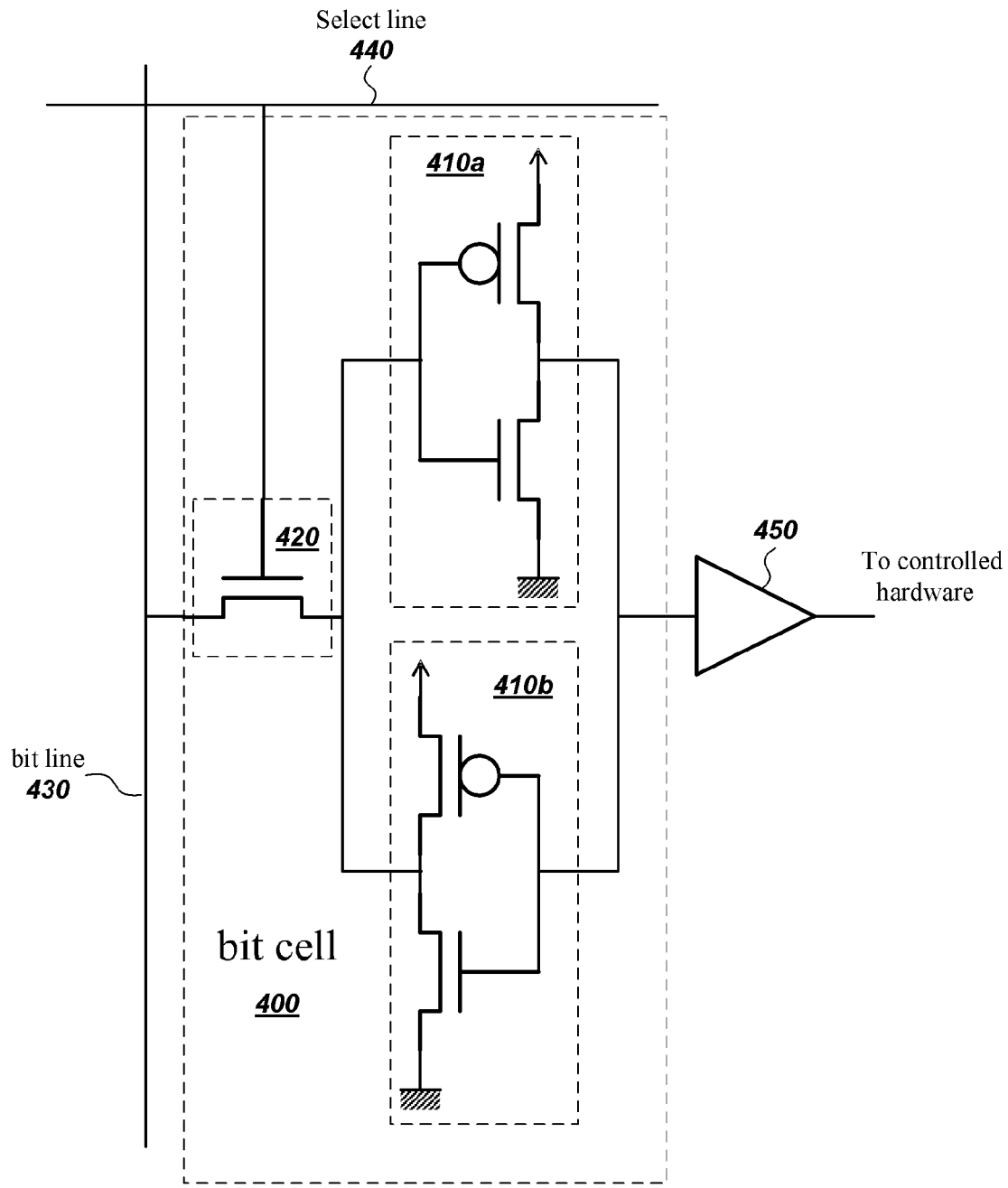
FIG. 4 illustrates a circuit diagram of a portion of a five transistor bit cell, controlling a circuit element, in accordance with at least one embodiment of the present invention.

In accordance with yet an additional feature of one embodiment, the integrated memory circuit is coupled to a plurality of circuit elements, such that bit cells of the memory block drive the circuit elements (see e.g., FIG. 4). In accordance with yet another feature of one embodiment, the plurality of circuit elements are coupled to the opposite side of the bi-stable loop from the access transistor (see e.g., FIG. 4).

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 1:
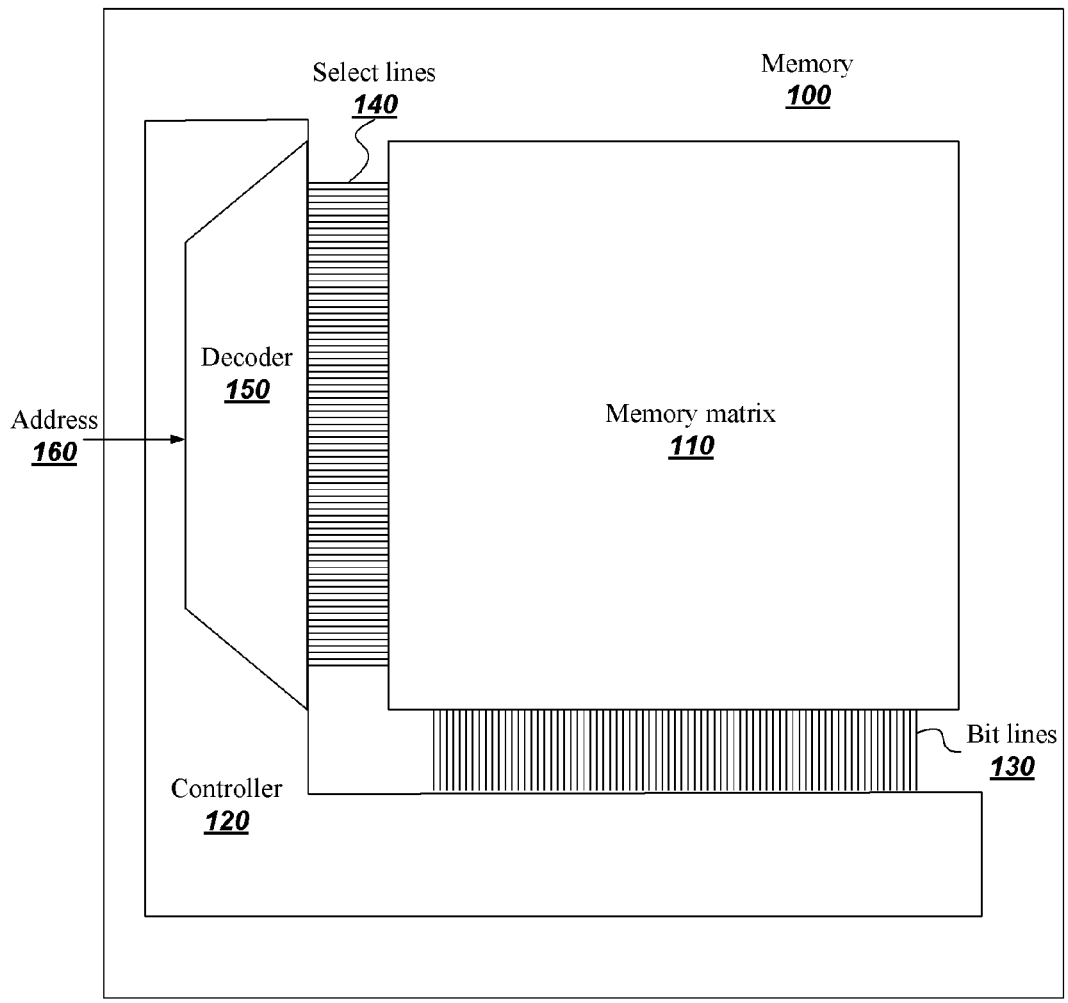
FIG. 1 illustrates a block diagram of a portion of memory in a reconfigurable circuit, employing one or more memory five transistor bit cells and a controller mechanism, in accordance with at least one embodiment of the present invention.

Referring now to FIG. 1, wherein a block diagram of a portion of memory in a reconfigurable circuit, employing one or more five-transistor memory bit cells and a controller mechanism, in accordance with at least one embodiment of the present invention, is shown. Accordingly, in view of the foregoing, there is provided with at least one embodiment of the invention a memory circuit 100 including a plurality of bit lines 130, a plurality of select lines 140, a controller 120, and a plurality of bit cells organized into a memory matrix 110. The controller 120 includes a decoder 150 configured to receive a memory address 160 and activate the necessary select lines and/or bit lines to access the data stored in the bit cells. For the illustrated embodiments, the enumerated elements are coupled as shown.

Figure 2:
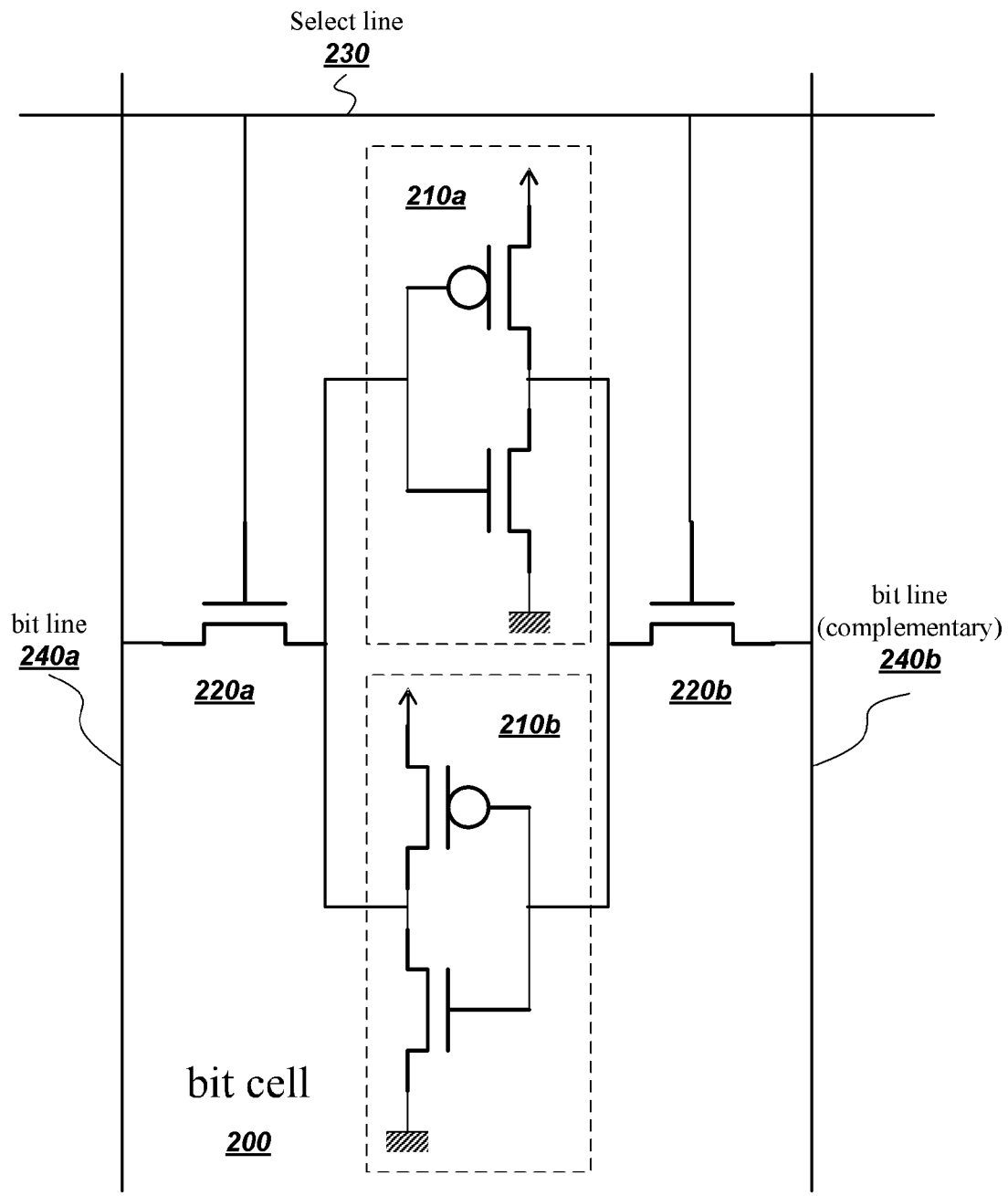
FIG. 2 illustrates a circuit diagram of a portion of a traditional memory six transistor bit cell.

As previously indicated, the memory matrix 110 may include a variety of different types of bit cells. FIG. 2 illustrates one example of a traditional six transistor bit cell 200, having two inverters 210 coupled to each other and two access transistors 220. The bit cell 200 also includes 2 bit lines 240 and a select line 230. While appropriate in more traditional memory configurations, the six transistor bit cell is excessive in programmable circuits, such as FPGA circuits.

A CMOS inverter 210 includes an N transistor and a P transistor configured according to 210a or 210b in FIG. 2. The two inverters 210a and 210b, whose output drives the input of the other inverter, form a bi-stable loop. Interestingly, both logic '0' and logic '1' are perpetuated in a bi-stable loop. As such, a designer may choose how to designate which value is being stored in the bi-stable loop of the bit cell. For example, a logic '0' may exist when a logic '0' is coupled to access transistor 220a and a logic '1' is coupled to access transistor 220b. Accordingly, logic '1' would exist when a logic '1' is coupled to access transistor 220a and a logic '0' is coupled to access transistor 220b. Alternatively, the opposite may be true.

When the access transistors 220 are made stronger than the transistors forming the bi-stable loop 210a and 210b, it is possible to force a value on either side of the loop despite the presence of an inverter 210 driving the opposite value. However, such a conflict will not last, because as soon as the logic value is forced onto one side of the bi-stable loop, the other side acquires the opposite value and the loop becomes stable again in the opposite state.

A N transistor may drive a logic '0' or a P transistor may drive a '1'. However, because N transistors are often stronger than similarly sized P transistors, many designs use N transistors, as access transistors 220, on each side of the bi-stable loop to force a logic '0' on either side, thereby providing the means to set the bit cell in any of the two stable states. Alternatively, the access transistors could use larger P transistors to force a logic '1'.

Either way, in the most recent CMOS technologies, it is impractical to force a logic '1' with a N transistor or a logic '0' with a P transistor. As such, a single access transistor cannot be used to set the bit cell in both of the two stable states. However, a single access transistor can force a logic '0' with a N transistor or a logic '1' with a P transistor.

Referring now to FIG. 3, wherein a circuit diagram of a five transistor bit cell, in accordance with various embodiments is shown. In various embodiments, five transistor bit cells 300 are included within the memory matrix 110. Each five transistor bit cell 300 includes two inverters 310a and 310b, whose output drives the input of the other inverter to form a bi-stable loop. In addition to this bi-stable loop, bit cell 300 includes one access transistor 320 having a gate coupled to bit line 330 and a source coupled to select line 340.

The five-transistor bit cell 300 retains one bit of memory, namely a logic '0' or a logic '1' and reduces the number of transistors needed in each bit cell by one, thereby making the design cheaper than usual in a CMOS integrated circuit.

Moreover, the five transistor bit cell 300 also contains only a single bit line and a single select line where the other designs often require three lines, either two bit lines or two select lines. As previously indicated, this is of particular interest in reconfigurable memory structures of FPGA devices where the metal layers are very crowded such that only two metal layer can be dedicated to the memory plane rather than the usual three or four layers found in conventional ASIC designs.

In the illustrated configuration, the access transistor is an N transistor, which can force logic '0' but struggles to force logic '1'. However, the illustrated access transistor 320 is configured according to a unique configuration, with the drain connected to the input of one inverter, the source connected to a bit line and the gate to a select line.

Still compared to the bit cell 200 in FIG. 2, the bit cell 300 in FIG. 3 lacks the second access transistor 220b, so that only one value can be written. For the simplicity of the description, we will assume the value is a one, although the value could also be zero. Because both the value and its complement are stored in the bi-stable loop of bit cell 300, one at each input of the two inverters, it is a pure matter of convention to decides that one state is a logic 0 (a logic one on the first inverter and a logic zero on the other) and the other state is a logic 1 (a logic zero on the first inverter and a logic one on the other). Despite this drawback, the illustrated configuration is very useful in FPGA's.

Referring now to FIG. 4, wherein a circuit diagram of a five transistor bit cell 400 controlling a circuit element 430 is shown. In this configuration, the memory block is coupled with some hardware so that each bit cell controls or configures a piece of the hardware. One embodiment includes a plurality of circuit elements coupled to the bit cells of the memory block. In this useful configuration, each bit cell 400 controls a circuit element 450 coupled to the side of the bi-stable loop, which was formed by inverters 410a & 410b, opposite to the side attached to the access transistor 420. When data is preloaded into the memory matrix, the memory block can then initiate the various circuit elements 450 upon activation. For example, the practice may be employed for a FPGA system, where the memory is typically written once at power up, or more generally at configuration time, where needing a full clear step before writing in the desired values has no timing cost to the FPGA system.

In at least one embodiment, the bit cell 400 is configured to control the circuit element 450 from the side of the bit cell 400 opposite from the side connected to the access transistor 420 so that when reading back the value of the bit cell 400 through the access transistor 420, the voltage disruption resulting from the read access will not disturb the said controlled circuit element 450. This is an additional advantage over a six transistor bit cell 200 configuration with 2 bit lines, because all voltages of the bit cells 200 are disturbed by the read process and would affect any attached circuit elements 450.

To accommodate the advantageous obsolescence of the second access transistor, embodiments of the present invention manipulate the power supply of the memory matrix. Various methods may be used to control the power supply voltage.

Referring now to FIG. 5, wherein a controller 500, employing a power supply control circuit 510 to control power to a memory matrix, is shown. In one embodiment, the power supply control circuit 510 includes three transistors (T1, T2, and T3). The power supply control circuit includes P transistor (T3) having a source coupled the power supply and a drain coupled to the bit cells, a first N transistor (T2) serially coupled to the P transistor (T3) to serve as a diode; and a second N transistor (T1) serially coupled to the first N transistor (T2), the second N transistor (T1) having a source coupled to ground.

Since these three transistors can drive a memory matrix containing thousands of bit cells, this configuration is much less expensive than placing another transistor in each bit cell, such as the structure shown in bit cell 200 of FIG. 2. The power supply control circuit 510 will drive the power supply to a power level close to the normal power supply when the command is a logic '0' and to a level that is about the threshold voltage of N transistor above the ground level (e.g., N transistor T1 drives node N1 to a logic '0' and N transistor T2, mounted as a diode drives the output to one N transistor threshold above this level). Simple and efficient, the power supply control circuit is self regulating, since voltage that is too low on the power supply would draw some current through the access transistor and the P transistor during the initialization phase and a voltage that is too high would prevent the bit cells from being initialized to the right level.

Figures 6A, 6B, 6C:
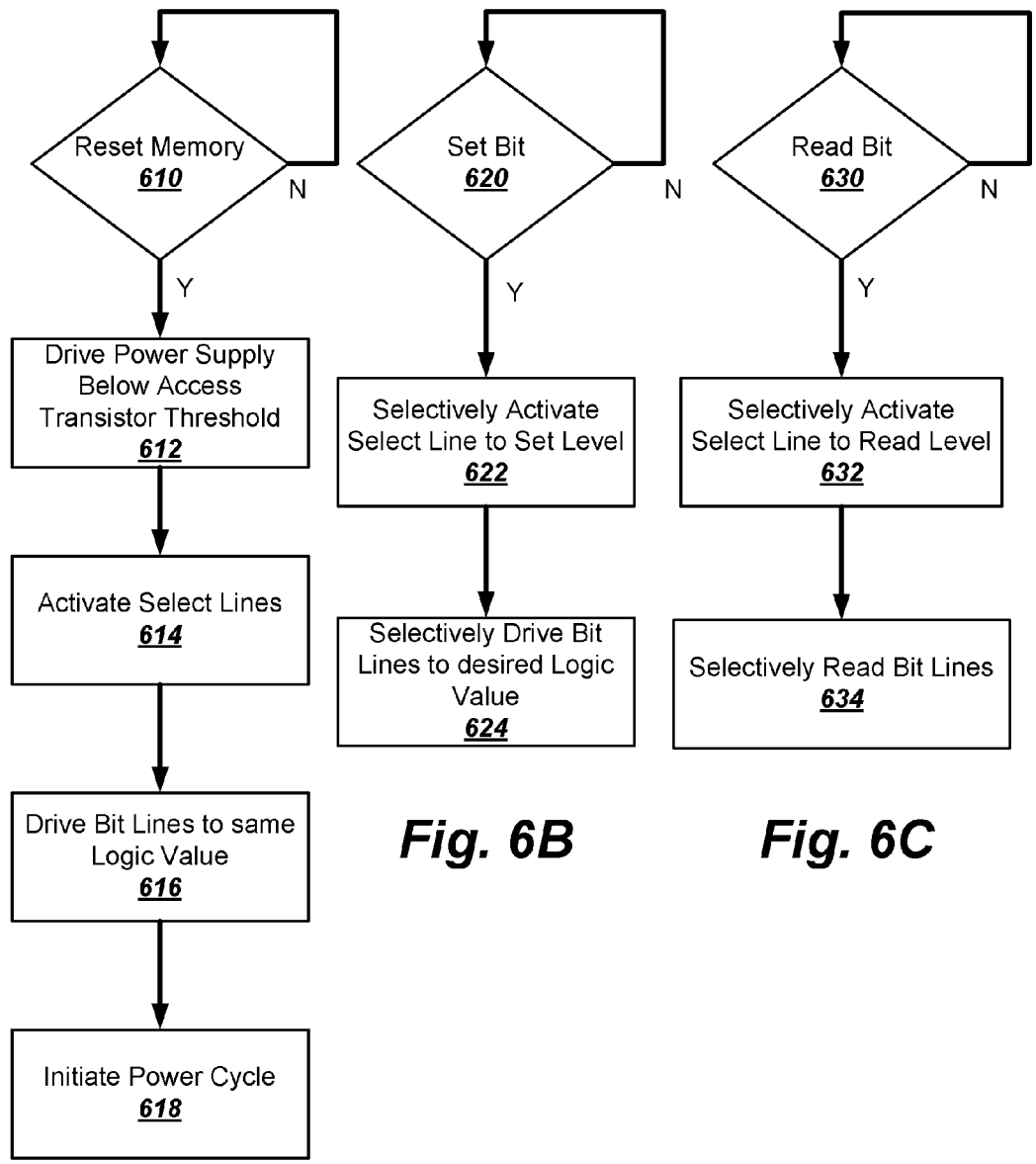
FIGS. 6A-6C illustrate flowchart views of a portion of methods of operation of the controller as presented in FIG. 1 in further detail, according to at least one embodiment of the present invention.

Referring now to FIGS. 6A-6C, wherein flowchart views of a portion of the methods of operation of the controller as presented in FIG. 1 in further detail, in accordance with various embodiments are shown. As illustrated in FIG. 1, the controller 120 is responsible for activating and driving the select lines 140 and the bit lines 130 coupled to the memory matrix 110. In addition, the controller 120 is also responsible for adjusting the power supply to the bit cells. Manipulation of these power lines enables the controller 120 to reset memory (FIG. 6A), set a bit in memory (FIG. 6B), or read a bit in memory (FIG. 6C).

In FIG. 6A, upon determining to reset memory in query block 610, the controller 120 drives the power supply of the memory matrix down to a level less than the threshold voltage of the access transistor (e.g., N transistor in FIG. 3) in block 612. The controller 120 then activates all the select lines in block 614 to a desired logic level. For example, in the illustrated embodiment of FIG. 3, the controller would apply a logic '1' to all select lines so that the access transistor of all the bit cells are active. In one embodiment, the logic '1' is a physical voltage value that represents a value approximately equivalent to the power supply voltage minus the threshold voltage of the bit cell P transistors. Thereby making the physical voltage value be above the threshold voltage of N transistors, which is sufficient to drive the other side of the bi-stable loop to the opposite logic value.

In block 616, the controller drives all the bit lines to a physical voltage value selected based on the desired logic value. For example, in the illustrated embodiment of FIG. 3, the controller would drive the bit lines to a physical value, which with the previously mentioned conventions would correspond to a logic '0' for each bit cell. Thus, in the illustrated embodiment of FIG. 3, the controller shall apply logic '1' to all bit lines to drive the side of the bit cells that is connected to the bit line through the access transistor to a value that is approximately equivalent to the power supply voltage minus the threshold voltage of the P transistors, because the opposing inverter has no power supply. This value is above the threshold voltage of N transistors, which is enough to drive the other side of the bi-stable loop to logic '0'. In block 618, the controller initiates a power cycle to drive up the power supply of the memory matrix back to its normal value (logic '1' in FIG. 3), resulting in a secure logic '0' being installed in all bit cells during ramp up.

To set a bit in memory, the controller identifies the set or writing operation in query block 620. In at least one embodiment, the controller 120 initially clears the full memory using the previous procedure outlined in FIG. 6A. Once the memory is reset, one embodiment configures the controller 120 to selectively activate desired select lines to set the level in block 622. Then the controller 120 selectively drives the bit lines to the desired logic value. In one embodiment, the values are written to all memory cells using ordinary methods. However, only bit cells needing logic '1' are written since the bit cell's initial value is a logic '0' for all bit cells, hence the unique access transistor (N transistor in FIG. 3) is enough to generate the desired logic '1'.

Because random data can only be written by first doing a global reset as illustrated in FIG. 6A and then setting the necessary bits as illustrated in FIG. 6B, in various embodiments, the system may be configured to subdivide the memory matrix to implement several smaller memories, called memory blocks, rather than a single large memory. For example, in one embodiment, when particular data is to be written in a particular word, the system is configured so that only one memory block must be reset rather than the full memory and/or memory matrix. These configurations are interesting embodiments, both in terms of performance, because only the memory block has to be fully reprogrammed rather than the whole memory, and in terms of usability, which in the context of a reconfigurable circuit, enables the parts of the circuits configured by the other memory blocks to continue running even when another memory block is reprogrammed.

Referring now to FIG. 7, wherein a circuit diagram of a controller employing a power supply control circuit with a fast discharge, in accordance with various embodiments, is shown. In the illustrated embodiment, the controller 700 has an additional transistor T4 to allow a fast discharge of the power supply line to a voltage below the threshold voltage of the N transistors, which thereby improves the speed at which the memory can be reset. More specifically, activating the fast discharge command line of T4 drives down the power supply of the memory matrix in conjunction with activating the reset command line. Once the desired lower threshold voltage has been acquired, the controller 700 stops the fast discharge by deactivating the fast discharge command line of T4. The reset command line remains on until the operation is completed.

Figure 8:
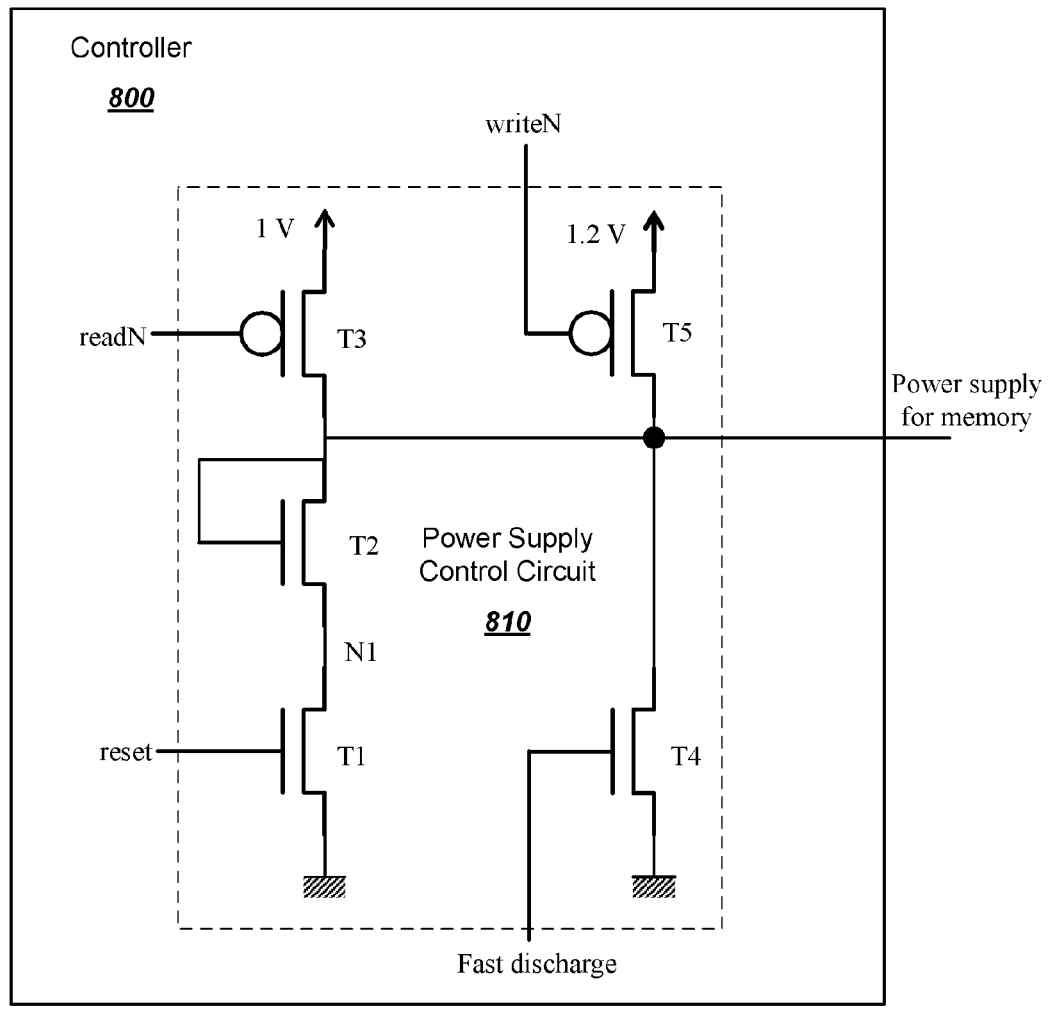
FIG. 8 illustrates a circuit diagram of a portion of a controller, employing a power supply control circuit with multiple circuit power supplies, in accordance with at least one embodiment of the present invention.

Referring now to FIG. 8, wherein a circuit diagram of a controller employing a power supply control circuit with multiple circuit power supplies, in accordance with various embodiments, is shown. In some CMOS device technologies, the noise margin is so low that the described bit cell configurations may be difficult to obtain because of the difficulty in accounting for the size of the access transistor: If the access transistor is too small, then it may not be strong enough to allow a secure write process. However, if the access transistor is too large, the read process may flip the bit that is being stored in the bit cell. FIG. 8 provides an exemplary embodiment, where multiple power supplies are used to select whether a read or write operation is to be performed, to address these issues. In these embodiments, a lower voltage is applied during set operations as described in FIG. 6B, during which command writeN is low and a higher voltage is applied to the memory matrix during read operations as described in FIG. 6C during which command readN is low.

Because a low power supply applied to the memory during set operations may imply some leakage in the driven logic in the case the bit cell is used in a reconfigurable circuit to configure some function, dividing the memory into smaller memory blocks and applying the lower voltage only in the zero or more blocks being written is beneficial in term of power consumption.

In various embodiments, the select line is driven to a lower voltage for the read process than for the write process. This technique is particularly useful in a five transistor bit cell design, because of a lack of symmetry within the five transistor bit cell. In contrast, six transistor bit cells are symmetrical so that the read process incurs the same perturbation on both sides of the bit cell, making a flip less likely to occur and the read process can be differential.

Figure 9B:
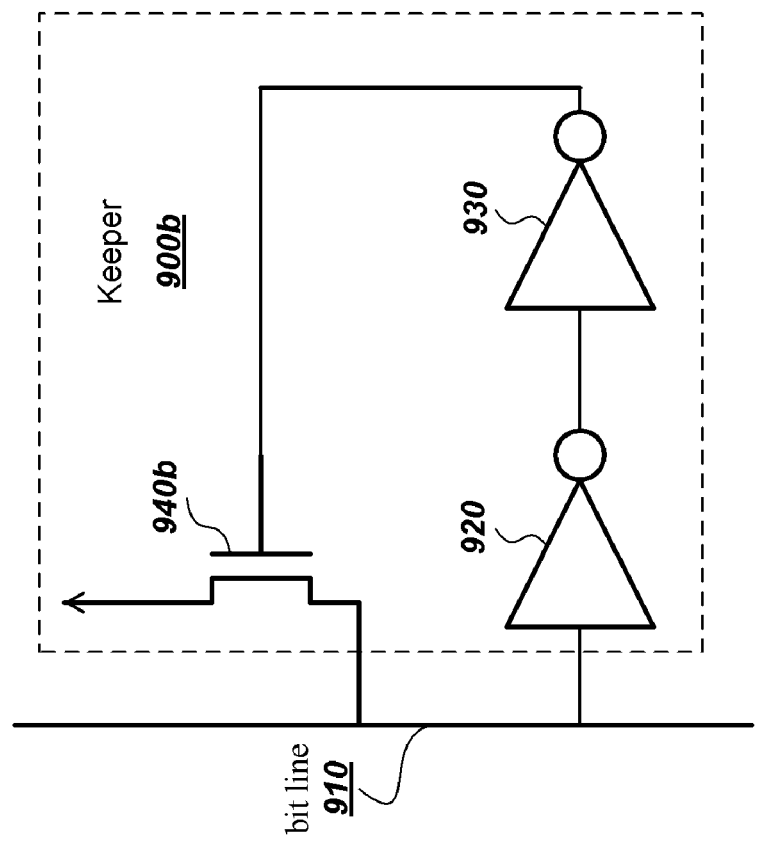
FIGS. 9A and 9B illustrate circuit diagrams of keeper circuits to supplant a bit cell in portions of a memory matrix as presented in FIG. 1, according to at least one embodiment of the present invention.
Figure 9A:
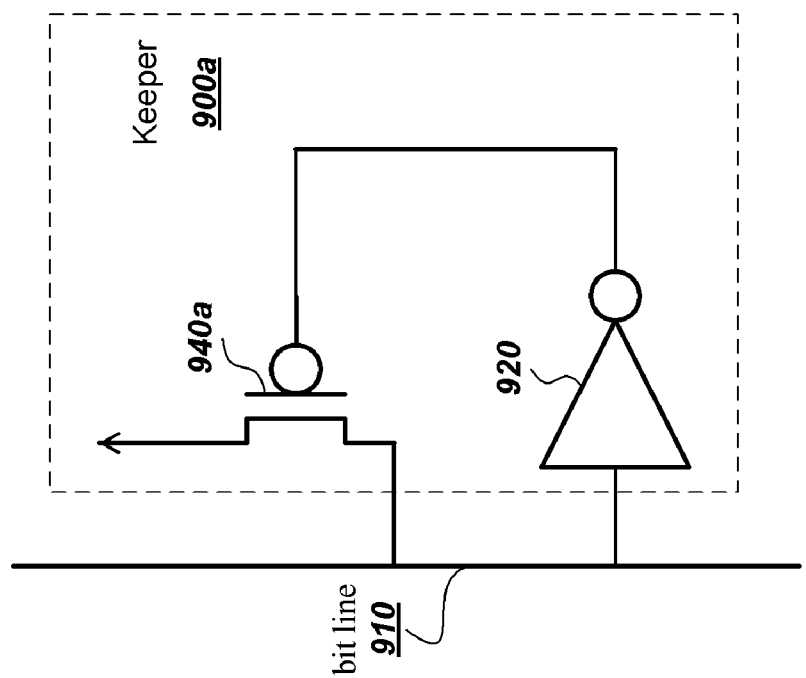

Referring now to FIGS. 9A and 9B, wherein circuit diagrams of keeper circuits that may be used to supplant a bit cell in portions of a memory matrix are shown. Depending on the particular characteristics of a given reconfigurable circuit, the full address range of a configuration address space may not be entirely populated with actual bit cells. For example, in one embodiment, not all clusters have a multiplier and therefore the configuration address space traditionally dedicated to the configuration of the multiplier would have no physical memory to associate with it in those clusters without a multiplier. However, in various embodiments, it still may be practical to provide a predictable value when such addresses are accessed. The illustrated circuit configurations are designed to provide this predictable value when such addresses are accessed and to include a keeper 900 coupled to a bit line 910. As such, a keeper 900 in accordance with one of the illustrated configurations is helpful to allow the same process to be used to compute a predictable checksum of the full configuration in the reconfigurable circuit without having to process various clusters, such as clusters with a multiplier and clusters without multipliers, differently.

Putting a keeper 900 into the cluster as an alternative when no bit cell is present may help maintain a consistent value for the position within the matrix. In one embodiment, the keeper 900 includes a few transistors arranged to facilitate maintaining a physical '1' on the bit line 910 once this level is already in effect. The keeper 900 provides that when no bit cell is present, various leakage will not decrease or improperly affect the level of the bit line 910. Moreover, in one configuration, the keeper 900 helps to ensure that designated value is read. For example, a physical '1' level, which, in accordance with the previously mentioned conventions, is read as a logical '0' by the illustrated circuit.

FIG. 9A illustrates how such a keeper 900 is traditionally configured with an inverter 920 whose input is coupled to the bit line 910 and whose output is coupled to the gate of a P transistor 940a whose source is coupled to the power supply and whose drain is coupled with the bit line 910.

Another alternative implementation is to implement the keeper 900 in accordance with the configuration illustrated in FIG. 9B, with an inverter 920 whose input is coupled to the bit line 910 driving a second inverter 930 whose output is coupled to the gate of a N transistor 940b whose source is coupled to the power supply and whose drain is coupled with the bit line 910. This configuration provides that the keeper 900 does not drive the bit line 910 above the precharge voltage, which is enough to ensure that a physical '1' is read.

Although specific embodiments have been illustrated and described herein, it will be appreciated by those of ordinary skill in the art and others, that a wide variety of alternate and/or equivalent implementations may be substituted for the specific embodiment shown and described without departing from the scope of the present invention. This application is intended to cover any adaptations or variations of the embodiment discussed herein. Therefore, it is manifested and intended that the invention be limited only by the claims and the equivalence thereof.

What is claimed is:
1. A memory circuit, comprising:
   a plurality of bit lines;
   a plurality of select lines;
   a plurality of bit cells; and
   a controller coupled to the plurality of bit lines and to the plurality of select lines, wherein the controller includes a power supply control circuit adapted to control the power supply voltage applied to the plurality of bit cells, wherein the controller is adapted to read a selected bit cell of the plurality of bit cells by a setting of a select line associated with the selected bit cell to a first level, and to set the selected bit cell by an activation of the select line associated with the selected bit cell to a second level, wherein the first level is lower than the second level, and
   wherein the power supply control circuit includes:
   a P transistor comprising a source and a drain, wherein the source of the P transistor is coupled to a power supply and wherein the drain of the P transistor is coupled to the plurality of bit cells;

a first N transistor serially coupled to the P transistor, wherein the first N transistor is adapted to operate as a diode; and a second N transistor serially coupled to the first N transistor, wherein a source of the second N transistor is coupled to ground and wherein both the P transistor and second N transistor are driven by a reset signal.

2. The memory circuit as recited in claim 1, wherein the controller is further adapted to read the plurality of bit cells via the bit lines and the select lines.

3. The memory circuit of claim 2, wherein the plurality of bit lines include at least one keeper.

4. The memory circuit of claim 1, wherein the power supply control circuit further comprises a third N transistor coupled to the plurality bit cells, wherein a source of the third N transistor is coupled to ground.

5. The memory circuit of claim 1, wherein the power supply control circuit further comprises a second P transistor coupled to the plurality of bit cells, wherein a source of the second P transistor is coupled to a second circuit power supply.

6. The memory circuit of claim 5, wherein the controller is further adapted to read the plurality of bit cells via the plurality of bit lines and the plurality of select lines, and wherein the P transistor is configured to selectively apply power from the power supply based upon a read access request-, and wherein the second P transistor is configured to selectively apply power from the second power supply based upon a set access request.

7. The memory circuit of claim 1, wherein the controller is adapted to perform a clear operation on the plurality of bit cells, wherein the clear operation includes a reduction of a power supply voltage applied to the plurality of bit cells, and wherein the controller is further adapted to selectively set the bit cells by selective activation of the plurality of select lines and by selective driving of the plurality of bit lines to logic zero.

8. The memory circuit of claim 7, wherein the clear operation further includes an activation of all of the plurality of select lines, and a driving of all of the plurality of bit lines to a logic one.

9. The memory circuit of claim 7, wherein the reduction of the power supply voltage includes a reduction of the power supply voltage to a power level substantially near the threshold voltage of the second N transistor above ground.

10. An integrated circuit comprising:
a memory block, the memory block having;
a plurality of bit lines;
a plurality of select lines;
a plurality of bit cells;
a controller coupled to the plurality of bit lines and to the plurality of select lines, wherein the controller of the memory block further comprises a power supply control circuit adapted to control the power supply voltage-applied to the plurality of bit cells, and wherein the power supply control circuit includes:
a P transistor having-a source coupled to a power supply and a drain coupled to the plurality of bit cells;
a first N transistor serially coupled to the P transistor, wherein the first N transistor is adapted to operate as a diode; and
a second N transistor serially coupled to the first N transistor, wherein a source of the second N transistor is coupled to ground and wherein both the P transistor and second N transistor are driven by a reset signal;
a third N transistor coupled to the plurality of bit cells, and wherein a source of the third N transistor is coupled to ground; and
a plurality of circuit elements correspondingly coupled to the plurality of bits cells.

11. The integrated circuit of claim 10, wherein the memory block further comprises a keeper coupled to a one of the plurality of bit lines.

12. The integrated circuit of claim 10, wherein the integrated circuit is a reconfigurable integrated circuit, and wherein the memory block is the configuration memory of the reconfigurable integrated circuit.

13. The integrated circuit of claim 12, wherein the reconfigurable integrated circuit comprises a Field Programmable Gate Array.

14. The integrated circuit of claim 10, wherein the power supply control circuit further comprises a second P transistor wherein a source of the second P transistor is coupled to a second circuit power supply and a drain of the second P transistor coupled to the plurality of bit cells.

15. The integrated circuit of claim 14, wherein the power supply control circuit further comprises a third N transistor, wherein a source of the third N transistor is coupled to ground, wherein a drain of the third N transistor is coupled to the drain of the second P transistor, and wherein the third N transistor is adapted to discharge the plurality of bit cells upon activation.

16. The integrated circuit of claim 10, wherein the controller is adapted to perform a clear operation on the plurality of bit cells, wherein the clear operation includes a reduction of a power supply voltage applied to the plurality of bit cells, and wherein the controller is adapted to selectively set the bit cells by selective activation of the plurality of select lines and a selective driving of the plurality of bit lines to logic zero.

17. The integrated circuit of claim 16, wherein the clear operation further includes an activation of all of the plurality of select lines, and a driving of all of the plurality of bit lines to a logic one.

18. The integrated circuit of claim 16, wherein the reduction of the power supply voltage includes a reduction of the power supply voltage to a power level substantially near the threshold voltage of the second N transistor above ground.

19. A memory circuit, comprising:
a plurality of bit lines;
a plurality of select lines;
a plurality of bit cells; and
a controller coupled to the plurality of bit lines and to the plurality of select lines, wherein the controller is adapted to perform a clear operation on the plurality of bit cells, wherein the clear operation includes a reduction of a power supply voltage applied to the plurality of bit cells to a level above zero volts and below a threshold voltage of access transistors of the plurality of memory cells, and wherein the controller is further adapted to selectively set the bit cells by selective activation of the plurality of select lines and by selective driving of the plurality of bit lines to logic zero.

* * * * *